(12) United States Patent
Kamohara et al.

(10) Patent No.: US 11,676,655 B2
(45) Date of Patent: Jun. 13, 2023

(54) SEMICONDUCTOR INTEGRATED CIRCUIT DEVICE AND WEARABLE DEVICE

(71) Applicant: Renesas Electronics Corporation, Tokyo (JP)

(72) Inventors: Shiro Kamohara, Tokyo (JP); Yasushi Yamagata, Tokyo (JP); Takumi Hasegawa, Hitachinaka (JP); Nobuyuki Sugii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/837,122

(22) Filed: Jun. 10, 2022

(65) Prior Publication Data

US 2022/0301618 A1 Sep. 22, 2022

Related U.S. Application Data

(63) Continuation of application No. 16/386,887, filed on Apr. 17, 2019, now Pat. No. 11,373,700, which is a
(Continued)

(30) Foreign Application Priority Data

Dec. 17, 2014 (JP) .................................. 2014-255557

(51) Int. Cl.
*G11C 11/417* (2006.01)
*H01L 27/12* (2006.01)
(Continued)

(52) U.S. Cl.
CPC .......... *G11C 11/417* (2013.01); *G04G 21/025* (2013.01); *G11C 5/146* (2013.01);
(Continued)

(58) Field of Classification Search
CPC . G11C 11/412; G11C 11/4125; G11C 11/417; H10B 10/12; H10B 10/18
See application file for complete search history.

(56) References Cited

U.S. PATENT DOCUMENTS 7,433,257 B2 10/2008 Yamagami
7,714,606 B2 5/2010 Ozawa et al.
(Continued)

FOREIGN PATENT DOCUMENTS

CN 1992280 A 7/2007
FR 3024917 A1 8/2014
(Continued)

OTHER PUBLICATIONS

Cauchy et al., "Questions and Answers on Fully Depleted SOI Technology for Next Generation CMOS Nodes," SOI Industry Consortium, Apr. 2010, pp. 1-17.
(Continued)

*Primary Examiner* — Han Yang
(74) *Attorney, Agent, or Firm* — McDermott Will & Emery LLP

(57) ABSTRACT

To provide a semiconductor device which can be stably operated while achieving a reduction of the power consumption.
A semiconductor device includes a CPU, a system controller which designates an operation speed of the CPU, P-type SOTB transistors, and N-type SOTB transistors. The semiconductor device is provided with an SRAM which is connected to the CPU, and a substrate bias circuit which is connected to the system controller and is capable of supplying substrate bias voltages to the P-type SOTB transistors and the N-type SOTB transistors. Here, when the system controller designates a low speed mode to operate the CPU
(Continued)

at a low speed, the substrate bias circuit supplies the substrate bias voltages to the P-type SOTB transistors and the N-type SOTB transistors.

6 Claims, 8 Drawing Sheets

Related U.S. Application Data continuation of application No. 15/888,426, filed on Feb. 5, 2018, now Pat. No. 10,311,943, which is a continuation of application No. 15/449,772, filed on Mar. 3, 2017, now Pat. No. 9,959,924, which is a continuation of application No. 14/952,377, filed on Nov. 25, 2015, now Pat. No. 9,646,679.

(51) Int. Cl.
G11C 5/14 (2006.01)
H10B 10/00 (2023.01)
G04G 21/02 (2010.01)
H01L 27/092 (2006.01)
H04B 1/3827 (2015.01)

(52) U.S. Cl.
CPC ........ *H01L 27/092* (2013.01); *H01L 27/1203* (2013.01); *H01L 27/1207* (2013.01); *H04B 1/385* (2013.01); *H10B 10/12* (2023.02); *H10B 10/18* (2023.02); *G11C 5/148* (2013.01)

(56) References Cited

U.S. PATENT DOCUMENTS

| 8,445,356 | B1 | 5/2013 | Cai et al. |
| 8,545,697 | B2 | 10/2013 | Thorgersen et al. |
| 9,646,679 | B2 | 5/2017 | Kamohara et al. |
| 9,959,924 | B2 | 5/2018 | Kamohara et al. |
| 10,311,943 | B2 | 6/2019 | Kamohara et al. |
| 2003/0076705 | A1 | 4/2003 | Yamaoka et al. |
| 2004/0155281 | A1 | 8/2004 | Osada et al. |
| 2005/0205930 | A1 | 9/2005 | Williams et al. |
| 2005/0266884 | A1 | 12/2005 | Marriott et al. |
| 2006/0274569 | A1 | 12/2006 | Joshi et al. |
| 2007/0176233 | A1 | 8/2007 | Ozawa et al. |
| 2007/0246767 | A1 | 10/2007 | Osada et al. |
| 2009/0134468 | A1 | 5/2009 | Tsuchiya et al. |
| 2011/0102019 | A1 | 5/2011 | Osada et al. |
| 2012/0319201 | A1* | 12/2012 | Sun ............... H01L 29/7827 257/338 |
| 2013/0230964 | A1 | 9/2013 | Imai et al. |
| 2016/0049189 | A1 | 2/2016 | Lecocq et al. |
| 2016/0156350 | A1 | 6/2016 | Tsuchiya et al. |
| 2016/0372486 | A1 | 12/2016 | Tsuchiya et al. |
| 2020/0202923 | A1 | 6/2020 | Yabuuchi et al. |
| 2022/0077191 | A1 | 3/2022 | Tsuchiya et al. |

FOREIGN PATENT DOCUMENTS

| JP | 2003-132683 A | 5/2003 |
| JP | 2004-207694 A | 7/2004 |
| JP | 2004-282776 A | 10/2004 |
| JP | 2007-134732 A | 5/2007 |
| JP | 2007-201236 A | 8/2007 |
| JP | 2009-135140 A | 6/2009 |

OTHER PUBLICATIONS

Ishigaki et al., "Silicon on Thin Box (SOTB) CMOS for Ultralow Standby Power with Forward-biasing Performance Booster," Solid-State Device Research Conference, 2008. ESSDERC 2008 38th European, pp. 198-201, DOI: 10.1109/ESSDERC.2008.4684732.
Tsuchiya et al., "Low Voltage (Vdd~0.6 V) SRAM Operation Achieved by Reduced Threshold Voltage Variability in SOTB (Silicon on Thin BOX)," 2009 Symposium on VLSI Technology, 2009, pp. 150-151.
Office Action dated Jan. 16, 2018, in Japanese Application No. 2014-255557.
Office Action dated Feb. 25, 2020, in Chinese Application No. 201510940599.1.
Korean Office Action issued in corresponding Korean Patent Application 10-2015-0178032, dated Feb. 14, 2023, with English translation.

\* cited by examiner

SEMICONDUCTOR INTEGRATED CIRCUIT DEVICE AND WEARABLE DEVICE

CROSS-REFERENCE TO RELATED APPLICATION

The present application claims priority from Japanese Patent Application No. 2014-255557 filed on Dec. 17, 2014, the content of which is hereby incorporated by reference into this application.

TECHNICAL FIELD OF THE INVENTION

The present invention relates to a semiconductor integrated circuit device and a wearable device, and particularly to a semiconductor integrated circuit device which is suitable to reduce power consumption.

BACKGROUND OF THE INVENTION

As a wearable device, there is a portable terminal device which is mounted on a wrist such as a smart watch. Such a portable terminal device is driven by power supplied from a battery, and is required to work for a long time. In order to achieve a function of the terminal and a function of the wrist watch, the portable terminal device is mounted with a semiconductor integrated circuit device (hereinafter, simply referred to as a semiconductor device) in which a microprocessor (hereinafter, referred to as a central processing unit (CPU)), a memory, and the like are built.

In order to make the portable terminal device work for a long time, it is considered that the portable terminal device is mounted with a semiconductor device in which a low-speed CPU operated at a low speed is built and a semiconductor device in which a high speed CPU operated at a high speed is built. In this case, for example, the function as the wrist watch is realized by the low-speed CPU (a sub CPU), and the function as the terminal is realized by the high-speed CPU (a main CPU). Since the low-speed CPU is operated at a low speed, the power consumption is low, so that it is possible to extend the operation time of the portable terminal device.

As a technique of reducing the power consumption in the semiconductor device, there is known a dynamic voltage and frequency scaling (DVFS). With the DVFS technique, it is possible to reduce the power consumption in the semiconductor device by lowering a power source voltage of the semiconductor device and by lowering a frequency for operating the semiconductor device. Since the power consumption in the semiconductor device can be reduced, the operation time of the portable terminal device can be extended.

For example, as a technique of reducing the power consumption in the semiconductor device, Japanese Patent Application Laid-Open Publication No. 2004-282776 (Patent Document 1) discloses a technique in which a substrate bias voltage is applied to a substrate of the semiconductor device, and the frequency for operating the semiconductor device is changed.

As a memory built in the semiconductor device, there is a static random access memory (hereinafter, referred to as an SRAM). Japanese Patent Application Laid-Open Publication No. 2003-132683 (Patent Document 2) discloses a technique of reducing the power consumption of the SRAM, for example.

SUMMARY OF THE INVENTION

In the configuration in which two semiconductor devices (that is, the semiconductor device having the main CPU built-in and the semiconductor device having the sub CPU built-in) are used, there is a concern about that the number of the mounted semiconductor devices is increased and the cost of the portable terminal device is increased. In addition, in the configuration in which the DVFS technique is used, even when the frequency is lowered to perform the operation at a low speed, a standby current caused by a leakage current is not reduced, so that a high effect is not expected with respect to the low power consumption. Furthermore, a changeable frequency range is about 50% depending on the DVFS technique, and the frequency cannot be changed in a unit of digit. As a result, a high effect is not expected with respect to the low power consumption.

In the configuration in which a substrate bias voltage supplied to the substrate of the semiconductor device is changed, it is difficult to stably operate the semiconductor device.

Patent Documents 1 and 2 fail to describe a semiconductor device which can be stably operated while achieving the reduction of the power consumption.

An object of the present invention is to provide a semiconductor device which can be stably operated while achieving a reduction of the power consumption.

The above and other objects and novel characteristics of the present invention will be apparent from the description of the present specification and the accompanying drawings.

The following is a brief description of an outline of the typical invention disclosed in the present application.

That is, a semiconductor integrated circuit device includes: a first circuit; a mode designation circuit that designates an operation speed of the first circuit; a second circuit that includes a P-type SOTB transistor and an N-type SOTB transistor and is connected to the first circuit; and a substrate bias circuit that is connected to the mode designation circuit and is capable of supplying first and second substrate bias voltages to the P-type SOTB transistor and the N-type SOTB transistor. Here, the substrate bias circuit supplies the first and second substrate bias voltages to the P-type SOTB transistor and the N-type SOTB transistor when the mode designation circuit designates a first operation mode to operate the first circuit at a first speed. In contrast, the substrate bias circuit does not supply the substrate bias voltage to the P-type SOTB transistor and the N-type SOTB transistor when the mode designation circuit designates a second operation mode to operate the first circuit at a second speed higher than the first speed.

Here, the SOTB is the abbreviation for Silicon on Thin Buried Oxide, and the SOTB transistor means a transistor using a silicon substrate on which an ultrathin insulation film and a silicon thin film are formed. In the SOTB transistor, a concentration of impurities in a channel region (a silicon thin film region) formed with a channel (in which a drain current flows) is lowered. Therefore, the SOTB transistor is also called a dopantless transistor. The P-type SOTB transistor means an SOTB transistor in which a P-type channel is formed for the drain current, and the N-type SOTB transistor means an SOTB transistor in which an N-type channel is formed for the drain current.

In the SOTB transistor, a concentration of impurities in the channel region (the silicon thin film region) formed with the channel is low. Therefore, a variation of threshold voltages among the SOTB transistors is small. In other words, a variation of the threshold voltages among the P-type SOTB transistors and a variation of the threshold voltages among the N-type SOTB transistors are small. With this configuration, it is possible to provide a semiconductor device which prevents the P-type SOTB transistor and/or the N-type SOTB transistor from erroneously entering an ON state or an OFF state by the variation of the threshold voltage when the substrate bias voltage is supplied, and which is stably operated even when the substrate bias voltage is supplied.

In addition, since an insulation film is interposed between the silicon substrate to which the substrate bias voltage is supplied and the silicon thin film region serving as the channel region, it is possible to prevent the leakage current from flowing between the silicon thin film and the silicon substrate even when the substrate bias voltage is supplied. With this configuration, it is possible to suppress the power consumption from being increased even when the substrate bias voltage is supplied. In other words, it is possible to provide a semiconductor device which is stably operated while achieving the reduction of the power consumption.

Furthermore, the threshold voltage of the SOTB transistor is changed in proportion to the value of the supplied substrate bias voltage. Therefore, it is possible to easily change each of the P-type SOTB transistor and the N-type SOTB transistor to have a desired threshold voltage according to the value of the substrate bias voltage.

As an example of supplying the substrate bias voltage, the silicon substrate has been described. However, in a case where a region facing the silicon thin film is, for example, a well region formed in the silicon substrate, the substrate bias voltage is supplied to the well region.

Further, in the present specification, an electric field effect transistor is simply referred as to a MOS transistor, and described distinctively from the SOTB transistor. Even in the electric field effect transistor, the MOS transistor formed with the P-type channel will be referred to as a P-type MOS transistor, and the MOS transistor formed with the N-type channel will be referred to as an N-type MOS transistor.

Among the inventions disclosed in the application, the advantageous effects obtained by the representatives will be briefly explained as below.

The present invention makes it possible to provide a semiconductor device which can be stably operated while achieving the reduction of the power consumption.

BRIEF DESCRIPTIONS OF THE DRAWINGS

DESCRIPTIONS OF THE PREFERRED EMBODIMENTS

As below, embodiments of the invention will be explained in detail with reference to the drawings. Note that, in all drawings for explanation of the embodiments, the same members basically have the same signs and their repetitive explanation will be omitted.

First Embodiment

<Overall Configuration of Semiconductor Device>

Figure 1:
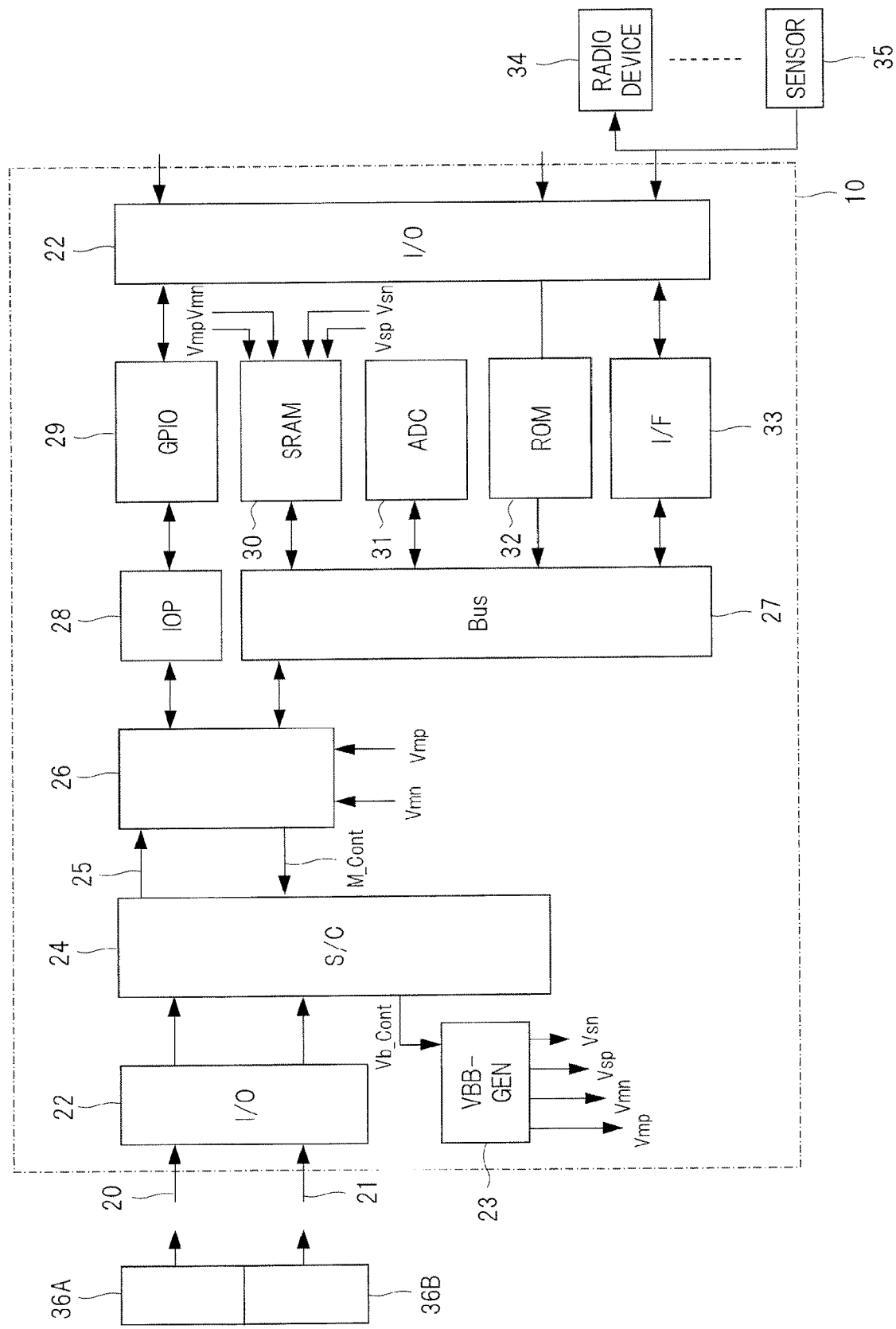
FIG. 1 is a block diagram illustrating a configuration of a semiconductor device according to a first embodiment.

FIG. 1 is a block diagram illustrating a configuration of a semiconductor device 10 according to a first embodiment. In this drawing, the block surrounded by a dashed line indicates a circuit formed by one semiconductor chip and a bus. The semiconductor device 10 includes a central processing unit (CPU) 26, a GPIO 29, an SRAM 30, an ADC 31, a read only memory (ROM) 32, an I/F 33, an S/C 24, an I/O 22, an IOP 28, and a VBB-GEN 23. Here, the I/O 22 indicates an input/output circuit, and includes a circuit for converting a voltage level of a signal between the outside and the inside of the semiconductor device 10, a circuit for buffering the signal and the like, which are not particularly limited.

In FIG. 1, the GPIO 29 is a general purpose input/output circuit, and the microprocessor (CPU) 26 accesses the GPIO 29 through the control circuit IOP 28. The GPIO 29 transmits and receives information with respect to the outside of the semiconductor device 10 through the input/output circuit I/O 22 based on the access from the CPU 26, and transmits and receives the information with respect to the CPU 26.

In FIG. 1, the SRAM 30 indicates a static random access memory as described above, and is connected to a bus 27. In addition, the ADC 31 indicates an analog/digital conversion circuit (hereinafter, referred to as AD conversion circuit), the ROM 32 indicates a non-volatile memory, and the I/F 33 indicates an interface circuit. Each of the AD conversion circuit ADC 31, the non-volatile memory ROM 32, and the interface circuit I/F 33 is connected to the bus 27. In addition, the CPU 26 is also connected to the bus 27. The CPU 26 accesses the SRAM 30, the AD conversion circuit ADC 31, the non-volatile memory ROM 32, and the interface circuit I/F 33 through the bus 27, and transmits and receives signals therebetween.

For example, the CPU 26 reads a program out of the non-volatile memory ROM 32 through the bus 27, and performs a process according to the read-out program. In the process, the CPU 26 uses the SRAM 30, the AD conversion circuit ADC 31, and the interface circuit I/F 33. For example, the CPU 26 transmits and receives information with respect to a device provided in the outside of the semiconductor device 10 using the interface circuit I/F 33.

In the outside of the semiconductor device 10, a plurality of devices are provided, but a radio device 34 and a sensor 35 are exemplified in FIG. 1. In the example illustrated in FIG. 1, the interface circuit I/F 33 includes an interface circuit with respect to the radio device 34 and an interface circuit with respect to the sensor 35, which are not particularly limited. The CPU 26 accesses the radio device 34 through the interface circuit for the radio frequency device, and transmits and receives information of a radio frequency signal using the radio device 34. In addition, the CPU 26 accesses the sensor 35 through the interface circuit for the sensor, converts the information from the sensor 35 by the AD conversion circuit ADC 31, for example, and uses the converted information in the process.

The semiconductor device 10 of the present embodiment is built in a wearable device (for example, a smart watch). The sensor 35 is used to measure a body temperature or the like of a person who wears the smart watch, and the radio device 34 is used to transmit the measured body temperature or the like to a so-called smart phone. Of course, the usage is not limited to the above configuration. For example, the radio device 34 may be used for the wireless connection with a so-called IoT (Internet of Things) machine.

In the present embodiment, the non-volatile memory ROM 32 is, but not particularly limited to, a non-volatile memory such as a flash memory which is electrically rewritable. The non-volatile memory ROM 32 is configured to be connected to the outside of the semiconductor device 10 through the input/output circuit I/O 22. With this configuration, the non-volatile memory ROM 32 is rewritable from the outside.

The SRAM 30 is used to temporarily store information when the CPU 26 performs the process according to the program. Of course, the usage is not limited to the above configuration.

In addition, the circuits connected to the bus 27 are not limited to the above circuits. For example, an interface circuit such as an SPI (Serial Peripheral Interface), a CART (Universal Asynchronous Receive Transmitter), or an I2C (Inter-Integrated Circuit) may be connected to the bus.

The semiconductor device 10 according to the embodiment includes two operation speed modes. In other words, there is provided a low speed mode 2 (a first operation mode) in which the semiconductor device 10 is operated at a low speed, and a high speed mode 1 (a second operation mode) in which the semiconductor device 10 is operated at a speed higher than the low speed mode 2. In the present embodiment, a clock signal for operating the semiconductor device 10 when the low speed mode 2 is designated and a clock signal for operating the semiconductor device 10 when the high speed mode 1 is designated are generated by two clock generators 36A and 36B to the outside of the semiconductor device 10. The clock generator 36A generates a high-speed clock signal 20, and the clock generator 36B generates a low-speed clock signal 21. In the present embodiment, the clock generators 36A and 36B include a crystal oscillation circuit, the frequency of the low-speed clock signal 21 is, for example, 32 KHz, and the frequency of a clock signal 20 of a high speed (hereinafter, referred to as a high-speed clock signal) is, for example, 40 MHz. In other words, the high-speed clock signal 20 and a clock signal 21 of a low speed (hereinafter, referred to as a low-speed clock signal) are different in the digit of frequency.

FIG. 1 illustrates an example in which the clock generators 36A and 36B are provided in the outside of the semiconductor device 10, but the clock generators 36A and 36B may be provided in the inside of the semiconductor device 10. In other words, the clock generators 36A and 36B may be formed in the same semiconductor chip as the circuit such as the CPU 26. In addition, one clock generator (for example, the clock generator 36B which generates the low-speed clock signal 21) may be provided in the outside of the semiconductor device 10, and a multiplying circuit may be provided in the semiconductor device 10, so that the high-speed clock signal 20 may be generated by the multiplying circuit from the low-speed clock signal 21.

In FIG. 1, the S/C 24 indicates a system controller (a mode designation circuit). A designation signal M_Cont from the CPU 26 and the clock signals 20 and 21 through the input/output circuit I/O 22 are supplied to the system controller S/C 24. The system controller S/C 24 selects the high-speed clock signal 20 or the low-speed clock signal 21 according to the designation signal M_Cont from the CPU 26, and supplies the selected signal to the CPU 26 as an operation clock signal 25. In other words, the system controller S/C 24 designates the high speed mode 1 and the low speed mode 2 by the designation signal M_Cont. In the designation of the high speed mode 1, the system controller S/C 24 supplies the high-speed clock signal 20 as the operation clock signal 25 to the CPU 26. On the other hand, in the designation of the low speed mode 2, the system controller S/C 24 supplies the low-speed clock signal 21 as the operation clock signal 25 to the CPU 26.

The CPU 26 is operated in synchronization with the supplied operation clock signal 25. Therefore, in a case where the low-speed clock signal 21 is supplied as the operation clock signal 25, the operation speed of the CPU 26 becomes slow. In a case where the high-speed clock signal 20 is supplied as the operation clock signal 23, the operation speed of the CPU 26 becomes fast.

For example, when a function of the wrist watch is realized, the CPU 26 supplies the designation signal M_Cont corresponding to the low speed mode 2 to the system controller S/C 24. In addition, when a function as the terminal is realized (for example, when an application is executed), the CPU 26 supplies the designation signal M_Cont corresponding to the high speed mode 1 to the system controller S/C 24. In the case of the function of the wrist watch, for example, only the displaying of time is sufficient, so that a processing capacity required for the CPU 26 is relatively small. Therefore, even when the operation speed of the CPU 26 is slow, the CPU 26 can realize the function of the wrist watch at a relatively short time. On the contrary, in a case where an application is executed as the function of the terminal, the processing capacity required for the CPU 26 becomes significantly large compared to the function of the write watch. Therefore, the operation speed of the CPU 26 is made fast in order to execute the application in a relatively short time. In this way, the operation speed of the CPU 26 can be made slow by the low speed mode 2, so that power consumption in the CPU 26 can be reduced.

Furthermore, in the present embodiment, the system controller S/C 24 generates a mode designation signal for controlling a substrate bias circuit (hereinafter, referred to as a substrate bias generation circuit) according to the designation signal M_Cont. In FIG. 1, the substrate bias circuit is depicted by the VBB-GEN 23, and is controlled by a mode designation signal Vb_Cont from the system controller S/C 24. The mode designation signal Vb_Cont is generated by the system controller S/C 24 based on the designation signal M_Cont.

The substrate bias circuit VSB-GEN 23 outputs substrate bias voltages (Vsp and Vsn) to be supplied to the SOTB (Silicon on Thin Buried Oxide) transistors and substrate bias voltages (Vmp and Vmn) to be supplied to the MOS transistors. The substrate bias voltage to be supplied to the SOTB transistor is output as two types of substrate bias voltages corresponding to a channel type of the SOTB transistor. In other words, the substrate bias voltage Vsp (a first substrate bias voltage) is output as the substrate bias voltage to be supplied to the P-type SOTB transistor, and the substrate bias voltage Vsn (a second substrate bias voltage) is output as the substrate bias voltage to be supplied to the N-type SOTB transistor.

Similarly, the substrate bias generation circuit VBB-GEN 23 also outputs the substrate bias voltage corresponding to the channel type of the MOS transistor. In other words, the substrate bias voltage Vmp (a third substrate bias voltage) is output as the substrate bias voltage to be supplied to the P type MOS transistor, and the substrate bias voltage Vmn (a fourth substrate bias voltage) is output to the N-type MOS transistor.

As to be described below, the voltage values of the substrate bias voltages Vsp, Vsn, Vmp, and Vmn output from the substrate bias generation circuit VBB-GEN 23 are determined by the mode designation signal Vb_Cont. Next, the circuit to which the substrate bias voltages Vsp, Vsn, Vmp, and Vmn are supplied will be described.

In FIG. 1, for example, the input/output circuit I/O 22 and the CPU 26 are configured not by the SOTB transistor, but by the N-type MOS transistor and the P-type MOS transistor. On the other hand, the SRAM 30 is configured by the SOTB transistor and the MOS transistor. The circuit (for example, the input/output circuit I/O 22) configured by the MOS transistor is not supplied with the substrate bias voltages Vmp and Vmn, and the CPU 26 is supplied with the substrate bias voltages Vmp and Vmn. The reason is that when the substrate bias voltage is supplied to the MOS transistor included in the input/output circuit I/O 22, the threshold voltage of the MOS transistor is changed, and an input logical threshold voltage of the input/output circuit I/O 22 is changed. On the other hand, the substrate bias voltages Vmp and Vmn are supplied to the CPU 26, so that a low power consumption can be achieved. Next, the circuit to which the substrate bias voltages Vsp, Vsn, Vmp, and Vmn are supplied will be described using the CPU 26 and the SRAM 30 as an example.

<Configurations of CPU 26 (First Circuit) and SRAM 30 (Second Circuit)>

Figure 2:
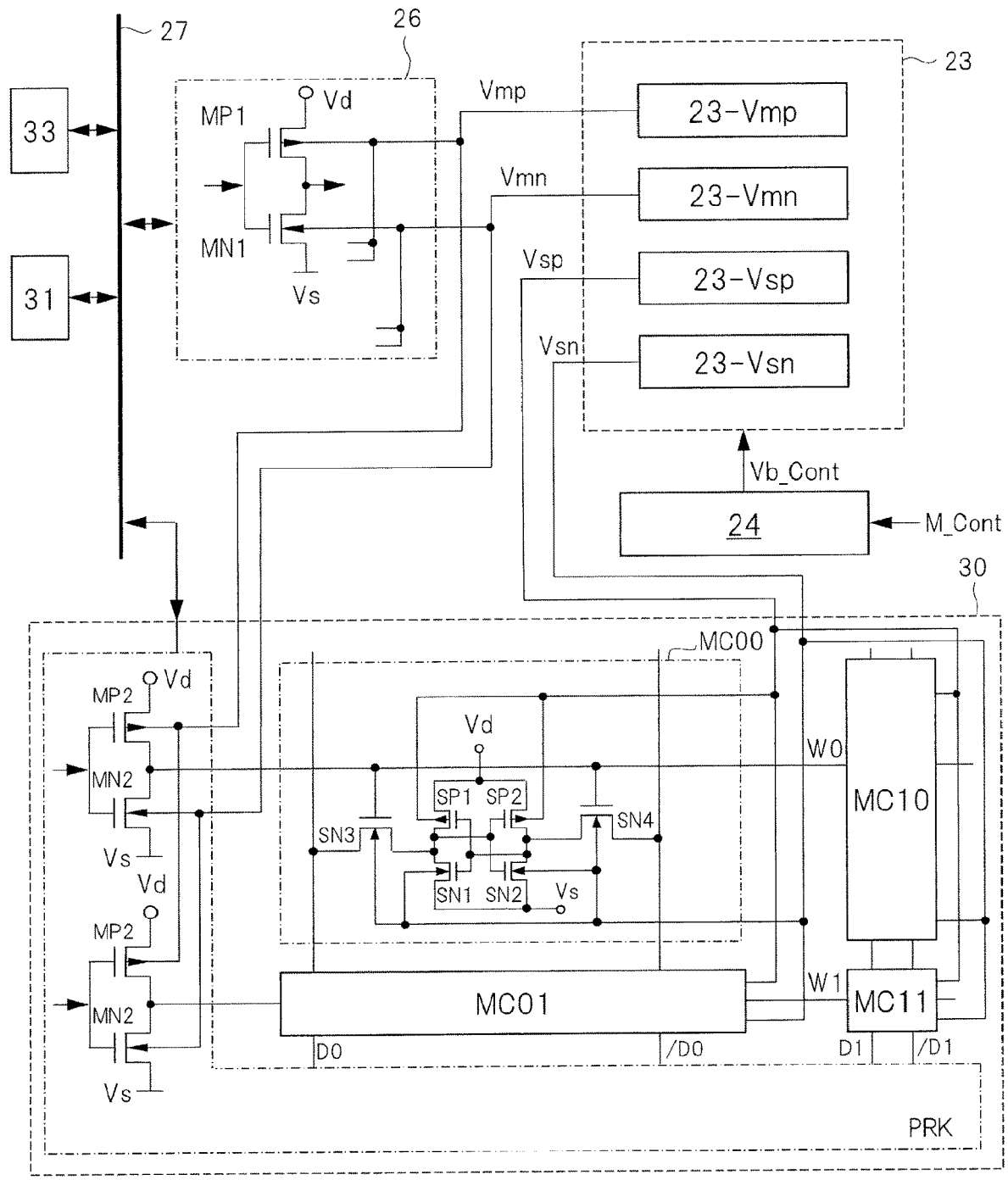
FIG. 2 is a circuit diagram illustrating a configuration of the semiconductor device according to the first embodiment.

FIG. 2 is a circuit diagram illustrating a configuration of the semiconductor device 10 according to the first embodiment. In this drawing, the circuit of the CPU 26 and the circuit of the SRAM 30 are illustrated in the semiconductor device 10 illustrated in FIG. 1. Even though the bus 27, the AD conversion circuit ADC 31, and the interface circuit I/F 33 illustrated in FIG. 1 are illustrated in FIG. 2, these components are the same as those in FIG. 1, and the description thereof will not be repeated. In addition, the configuration of the substrate bias circuit VBB-GEN 23 is also illustrated in FIG. 2. Herein, for the convenience of explanation, the substrate bias circuit VBB-GEN 23 is illustrated to include a substrate bias generation circuit 23-Vsp which generates the substrate bias voltage Vsp, a substrate bias generation circuit 23-Vsn which generates the substrate bias voltage Vsn, a substrate bias generation circuit 23-Vmp which generates the substrate bias voltage Vmp, and a substrate bias generation circuit 23-Vmn which generates the substrate bias voltage Vmn, but the number of these components are not limited.

The CPU 26 (the first circuit) is configured by a plurality of P-type MOS transistors and a plurality of N-type MOS transistors. In FIG. 2, one P-type MOS transistor MP1 and one N-type MOS transistor MN1 are exemplarily illustrated among the plurality of P-type MOS transistors and the plurality of N-type MOS transistors. A power source voltage Vd is supplied to the source of the P-type MOS transistor MP1, and the drain thereof is connected to the drain of the N-type MOS transistor MN1. In addition, a ground voltage Vs is supplied to the source of the N-type MOS transistor MN1. The gate of the N-type MOS transistor MN1 and the gate of the P-type MOS transistor MP1 are commonly connected. In other words, an inverter circuit is configured by the N-type MOS transistor MN1 and the P-type MOS transistor MP1. The CPU 26 is configured by combining a plurality of logical circuits such as the inverter circuit, sequential circuits, and memory circuits.

Next, the configuration of the SRAM 30 (the second circuit) will be described. The SRAM 30 includes a memory cell array (not illustrated) which includes a plurality of memory cells MC00 to MCnn disposed in a matrix shape, and a peripheral circuit PRK which is connected to the memory cell array. In each row of the memory cell array, word lines W0 to Wn are disposed, and in each column, complementary data line pairs D0, /D0 to Dn, /Dn are disposed. Here, the data lines /D0 to /Dn indicate data lines which transfer inverse phase signals to the data lines D0 to Dn. Each of the memory cells MC00 to MCnn is connected to the word lire which is disposed in the row where the subject memory cell is disposed, and to the complementary data line pair which is disposed in the column where the subject memory cell is disposed.

In FIG. 2, memory cells MC00 to M011 with two rows and two columns, the word lines W0 and W1 corresponding to these memory cells MC00 to MC11, and the complementary data line pairs D0, /D0 and D1, /D1 are exemplarily illustrated among the memory cells MC00 to MCnn which are disposed in the memory cell array. The configurations of the memory cells MC00 to MCnn are the same as each other, so that the circuit configuration of only the memory cell MC00 is illustrated in FIG. 2.

Herein, the configuration of the memory cell 1 will be described using the memory cell MC00 as an example of the circuit configuration. The memory cell MC00 is configured by the SOTB transistor. In other words, the memory cell MC00 includes P-type SOTB transistors SP1 and SP2 and the N-type SOTB transistors SN1, SN2, SN3, and SN4.

The power source voltage Vd is supplied to the source of the P-type SOTB transistor SP1, and the drain thereof is connected to the drain of the N-type SOTB transistor SN1. The ground voltage Vs is supplied to the source of the N-type SOTB transistor SN1. The gate of the P-type SOTB transistor SP1 and the gate of the N-type SOTB transistor SN1 are connected to each other. Therefore, a first inverter circuit is configured by the gate of the P-type SOTB transistor SP1 and the gate of the N-type SOTB transistor SN1 as inputs, and the drain of the P-type SOTB transistor SP1 and the drain of the N-type SOTB transistor SN1 as outputs.

Similarly, the power source voltage Vd is supplied to the source of the P-type SOTB transistor SP2, and the drain thereof is connected to the drain of the N-type SOTB transistor SN2. The ground voltage Vs is supplied to the source of the N-type SOTB transistor SN2. The gate of the P-type SOTB transistor SP2 and the gate of the N-type SOTB transistor SN2 are connected to each other. Therefore, a second inverter circuit is configured by the gate of the P-type SOTB transistor SP2 and the gate of the N-type SOTB transistor SN2 as inputs, and the drain of the P-type SUM transistor SP2 and the drain of the N-type SOTB transistor SN2 as outputs.

The input of the first inverter circuit is connected to the output of the second inverter circuit, and the input of the second inverter circuit is connected to the output of the first inverter circuit. In other words, the input and the output of the first inverter circuit are cross-connected to the output and the input of the second inverter circuit so as to form a flip flop circuit. A pair of input/output of the flip flop circuit (that is, the input of the first inverter circuit (the output of the second inverter circuit) and the input of the second inverter circuit (the output of the first inverter circuit)) is connected to the corresponding complementary data line pair D0, /D0 through the N-type SOTB transistors SN3 and SN4 for transmission (the SOTB transistor for transmission). In addition, the gates of the SOTB transistors SN3 and SN4 for transmission are connected to the corresponding word line W0.

The word lines W0 to Wn and the complementary data line pairs D0, /D0 to Dn, /Dn of the memory cell array are connected to the peripheral circuit PRK. The peripheral circuit PRK is connected to the bus 27, and receives an address signal (not illustrated) and a read/write control signal (not illustrated) through the bus 27. The peripheral circuit PRK selects a word line designated by the address signal from among the plurality of word lines W0 to Wn based on the supplied address signal, and sets the selected word line to a high level. In addition, the peripheral circuit PRK selects a complementary data line pair designated by the address signal from among the plurality of complementary data line pairs D0, /D0 to Dn, /Dn based on the supplied address signal.

When the read/write control signal designates a read operation, the peripheral circuit PRK supplies the information from the selected complementary data line pair to the bus 27. In this case, the information is supplied to the bus 27 from a memory cell which is connected to the selected complementary data line pair and has the high level voltage of the connected word line. On the other hand, when the read/write control signal designates a write operation, the peripheral circuit PRK supplies the information in the bus 27 to the selected complementary data line pair. In this case, the information in the bus 27 is supplied to the memory cell which is connected to the selected complementary data line pair and has the high level voltage of the connected word line, and the write operation is performed therein.

The write operation and the read operation will be described as an example in a case where the word line W0 is selected and the complementary data line pair D0, /D0 is selected by the peripheral circuit PRK. When the word lin W0 rises to a high level by selection, the SOTB transistors SN3 and SN4 for transmission in the selected memory cell MC00 also enter the ON state.

In the write operation, the voltage of the complementary data line pair D0, /D0 is transferred to a pair of input/output of the flip flop circuit through the SOTB transistors SN3 and SN4 for transmission. In other words, the voltage of the complementary data line D0 is supplied to the input of the second inverter circuit through the SOTB transistor SN3 for transmission, and the voltage of the complementary data line /D0 is supplied to the input of the first inverter circuit through the SOTB transistor SN4 for transmission. The voltage (signal) of the complementary data line /D0 has the inverse phase with respect to the voltage (signal) in the complementary data line D0. Therefore, for example, the high level signal is supplied to the input of the first inverter circuit through the SOTB transistor SN3 for transmission, and the low level signal is supplied to the input of the second inverter circuit through the SOTB transistor SN4 for transmission. Accordingly, a state maintained by the flip flop circuit is determined by the signal in the complementary data line pair D0, /D0, and the write operation is performed in the memory cell MC00.

On the other hand, in the read operation, a pair of input/output of the flip flop circuit is connected to the complementary data line pair D0, /D0 through the SOTB transistors SN3 and SN4 for transmission. In other words, the output of the second inverter circuit is connected to the complementary data line /D0 through the SOTB transistor SN4 for transmission, and the output of the first inverter circuit is connected to the complementary data line D0 through the SOTB transistor SN3 for transmission. For example, in the flip flop circuit, in a case where the output of the first inverter circuit is maintained at the low level and the output of the second inverter circuit is maintained at the high level, the low level signal is supplied to the complementary data line D0 through the SOTB transistor SN3 for transmission, and the high level signal is supplied to the complementary data line /D0 through the SOTB transistor SN4 for transmission.

Even in a case where the word lines and the complementary data line pairs corresponding to the other memory cells MC01 and MC10 to MCnn are selected is also the same as that of the memory cell MC00.

In addition, in a case where the peripheral circuit PRK does not select the word line W0 (that is, the low level), both the SOTB transistors SN3 and SN4 for transmission enter the OFF state. Therefore, the complementary data line pair is electrically separated from the input/output of the flip flop circuit in the memory cell MC00. At this time, since the power source voltage Vd and the ground voltage Vs are supplied to the flip flop circuit, the maintained state is continuously kept. Similarly, even in a case where the corresponding word lines are not selected in the other memory cells, the maintained state is continuously kept.

The peripheral circuit PRK is configured by a plurality of P-type MOS transistors and a plurality of N-type MOS transistors. For example, the peripheral circuit PRK includes a decoder circuit which decodes the address signal and a driver circuit which transfers the outputs of the decoder circuit to the word lines, and these circuits are configured by the plurality of P-type MOS transistors and the plurality of N-type MOS transistors. In FIG. 2, some of the P-type MOS transistors and the N-type MOS transistors are representatively illustrated from among the plurality of P-type MOS transistors and the plurality of N-type MOS transistors of the peripheral circuit. PRK. In other words, FIG. 2 illustrates the MOS transistor of output portions of the driver circuit which supplies the voltages to the word lines W0 and W1 for selection or non-selection.

In the drawing, the output portions of the driver circuit have the same configuration, and include a P-type MOS transistor MP2 and an N-type MOS transistor MN2. Here, the power source voltage VP is supplied to the source of the P-type MOS transistor MP2, and the drain thereof is connected to the corresponding word line (for example, W0). In addition, the ground voltage Vs is supplied to the source of the N-type MOS transistor MN2, and the drain thereof is connected to the corresponding word line (W0). The gate of the P-type MOS transistor MP2 and the gate of the N-type MOS transistor MN2 are commonly connected, and a signal decoded by the decoder circuit is transferred.

Therefore, in the output portion of the driver circuit corresponding to the word line (for example, W0) designated by the address signal, the P-type MOS transistor MP2 enters the ON state, and the N-type MOS transistor MN2 enters the OFF state. As a result, the power source voltage Vd (the high level) is supplied to the selected word line (W0) through the P-type MOS transistor MP2. On the other hand, in the output portion of the driver circuit corresponding to the word line (for example, W1) not designated by the address signal, the P-type MOS transistor MP2 enters the OFF state, and the N-type MOS transistor MN2 enters the ON state. As a result, the ground voltage Vs (the low level) is supplied to the non-selected word line (W1) through the N-type MOS transistor MN2.

As will be described below using FIGS. 3A and 3B, each of the P-type SOTB transistor, the N-type SOTB transistor, the P-type MOS transistor, and the N-type MOS transistor includes a source region (corresponding to a source), a drain region (corresponding to a drain), a gate electrode (corresponding to a gate), and a back gate region (corresponding to a back gate).

In the present embodiment, the substrate bias voltage Vsp (the first substrate bias voltage) is supplied to the back gates of the P-type SOTB transistors SP1 and SP2 of each of the memory cells MC00 to MCnn of the memory cell array in the SRAM 30. In addition, the substrate bias voltage Vsn (the second substrate bias voltage) is supplied to the back gates of the N-type SOTB transistors SN1 to SN4 of each of the memory cells MC00 to MCnn. On the other hand, the substrate bias voltage Vmp (the third substrate bias voltage) is supplied to the back gate of each of the plurality of P-type MOS transistors (MP2) of the peripheral circuit PRK in the SRAM 30, and the substrate bias voltage Vmn (the fourth substrate bias voltage) is supplied to the back gate of each of the plurality of N-type MOS transistors (MN2) of the peripheral circuit PRK in the SRAM 30. The substrate bias voltage Vmp (the third substrate bias voltage) is also supplied to the back gate of each of the plurality of P-type MOS transistors (MP1) of the CPU 26, and the substrate bias voltage Vmn (the fourth substrate bias voltage) is supplied to the back gate of each of the plurality of N-type MOS transistors (MN1) of the CPU 26.

In other words, in the present embodiment, the substrate bias voltage Vmp having the same voltage value is supplied to the back gate of each of the P-type MOS transistor (MP1) of the CPU 26 and the P-type MOS transistor (MP2) of the peripheral circuit PRK in the SRAM 30, and the substrate bias voltage Vmn having the same voltage value is supplied to the back gate of each of the N-type MOS transistor (MN1) of the CPU 26 and the N-type MOS transistor (MN2) of the peripheral circuit PRK in the SRAM 30.

In addition, the back gates of the P-type SOTB transistors SP1 and SP2 of each memory cell are supplied with the substrate bias voltage Vsp which has the same P channel type but is different from the substrate bias voltage Vmp. Similarly, the back gates of the N-type SOTB transistors SN1 and SN2 of each memory cell are supplied with the substrate bias voltage Vsn which has the same N channel type but is different from the substrate bias voltage Vmn. In addition, the substrate bias voltage Vsp and the substrate bias voltage Van are generated by the substrate bias generation circuits 23-Vsp and 23-Vsn so as to be different in polarity from each other, and the substrate bias voltage Vmp and the substrate bias voltage Vmn are generated by the substrate bias generation circuits 23-Vmp and 23-Vmn so as to be different in polarity to each other. Further, the substrate bias voltage Vsp and the substrate bias voltage Vmp have the same polarity, and the substrate bias voltage Vsn and the substrate bias voltage Vmn have the same polarity.

<Structures of MOS Transistor and SOTB Transistor>

Next, the structures of the MOS transistor and the SOTB transistor will be described using FIGS. 3A and 3B. FIG. 3A is a cross-sectional view schematically illustrating the structures of the P-type MOS transistor and the N-type MOS transistor. In addition, FIG. 3B is a cross-sectional view schematically illustrating the structures of the P-type SOTB transistor and the N-type SOTB transistor.

The plurality of P-type MOS transistors have the same structure, and the plurality of N-type MOS transistors also have the same structure. Therefore, the description will be made on assumption that the P-type MOS transistor described using FIG. 3A corresponds to the P-type MOS transistor MP1 illustrated in FIG. 2, and an N-type MOSFET transistor corresponds to the N-type MOS transistor MN1 illustrated in FIG. 2. In addition, the plurality of P-type SOTB transistors have the same structure, and the plurality of N-type SOTB transistors also have the same structure. Therefore, the description will be made on assumption that the P-type SOTB transistor described using FIG. 3B corresponds to the P-type SOTB transistor SP1 illustrated in FIG. 2, and the N-type SOTB transistor corresponds to the N-type SOTS transistor SN1 illustrated in FIG. 2.

These MOS transistors and SOTB transistors are formed in one semiconductor chip. In FIGS. 3A and 3B, a substrate 40 is shared by the MOS transistor and the SOTB transistor. Herein, the description will be made on assumption that the substrate 40 is a P channel type (hereinafter, referred to as P-type) silicon substrate.

Figure 3A:
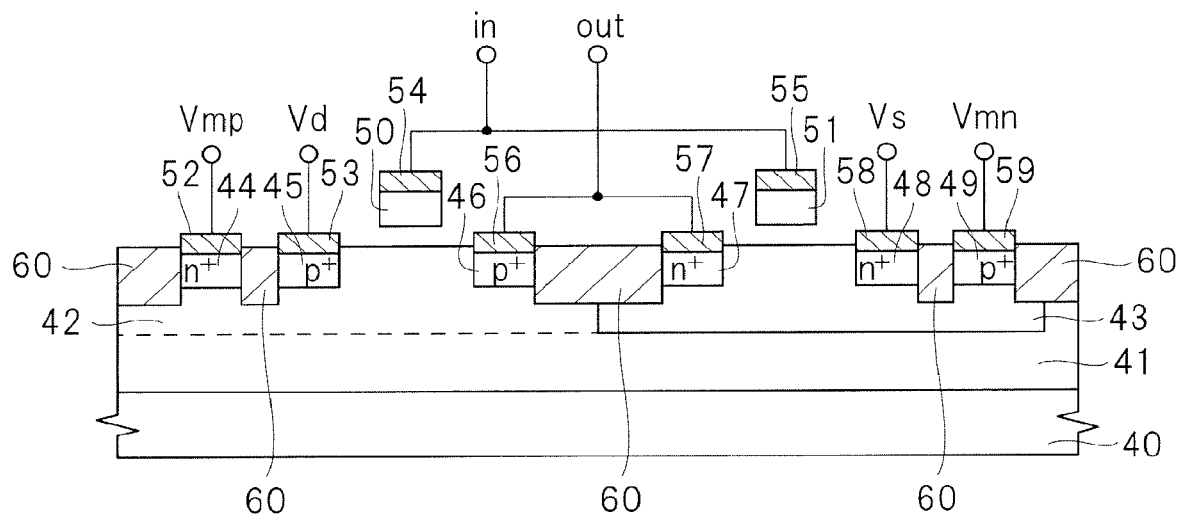
FIGS. 3A and 3B are cross-sectional views schematically illustrating structures of a MOS transistor and an SOTB transistor.

In FIG. 3A, an N channel type (hereinafter, referred to as N-type) well region 41 is formed in the P-type silicon substrate 40. In the N-type well region 41, an N-type well region 42 and a P-type well region 43 are formed. In the N-type well region 42, a $P^+$-type region 45 serving as the source region of the P-type MOS transistor (MP1), a $P^+$-type region 46 serving as the drain region of the P-type MOS transistor (MP1), and an $N^+$-type region 44 are formed. In this drawing, the gate electrode 50 of the P-type MOS transistor (MP1) is illustrated. The gate electrode 50 is formed on the N-type well region 42 through an insulation film (a gate insulation film) which is not illustrated. In FIG. 3A, for the ease visibility of the drawing, the gate electrode 50 is depicted to be separated from the source region 45 and the drain region 46, but practically the gate electrode 50, the source region 45, and the drain region 46 are formed in an overlapping manner. In addition, the $N^+$-type region 44 is a region for supplying the substrate bias voltage Vmp to the N-type well region 42.

In FIG. 3A, an electrode 52 is formed to supply the substrate bias voltage Vmp to the $N^+$-type region 44, and an electrode 53 is formed to supply the power source voltage Vd to the $P^+$-type region 45. In addition, in FIG. 3A, an electrode 56 is formed to connect the $P^+$-type region 46 to the output out, and an electrode 54 is formed to connect the gate electrode 50 to the input in.

In the P-type well region 43 described above, an $N^+$-type region 48 serving as the source region of the N-type MOS transistor (MN1), an $N^+$-type region 47 serving as the drain region of the N-type MOS transistor (MN1), and a $P^+$-type region 49 are formed. In this drawing, a gate electrode 51 of the N-type MOS transistor (MN1) is illustrated. The gate electrode 51 is formed on the P-type well region 43 through an insulation film (the gate insulation film) which is not illustrated. In FIG. 3A, for the ease visibility of the drawing, the gate electrode 51 is also depicted to be separated from the source region 48 and the drain region 47, but practically the gate electrode 51, the source region 48, and the drain region 47 are formed in an overlapping manner. In addition, the $P^+$-type region 49 is a region to supply the substrate bias voltage Vmn to the P-type well region 43.

In FIG. 3A, an electrode 59 is formed to supply the substrate bias voltage Vmn to the $P^+$-type region 49, and an electrode 58 is formed to supply the ground voltage Vs to the $N^+$-type region 48. In addition, in FIG. 3A, an electrode 57 is formed to connect the N⁺-type region 47 to the output out, and an electrode 55 is formed to connect the gate electrode 51 to the input in.

The substrate 40, the N-type well regions 41 and 42, the P-type well region 43, the P⁺-type regions 45, 46, and 49, and the N⁺-type regions 44, 47, and 48 each are made of silicon containing impurities, and the channel types thereof are determined depending on the contained impurities.

Further, when a voltage is applied to the gate electrode 50 (51), a channel is formed in the portion which is the N-type well region 42 (the P-type well region 43) on the lower side of the gate electrode 50 (51) and interposed by the source region 45 (48) and the drain region 46 (47). In addition, in FIG. 3A, an insulation region 60 is formed to separate elements.

Figure 3B:
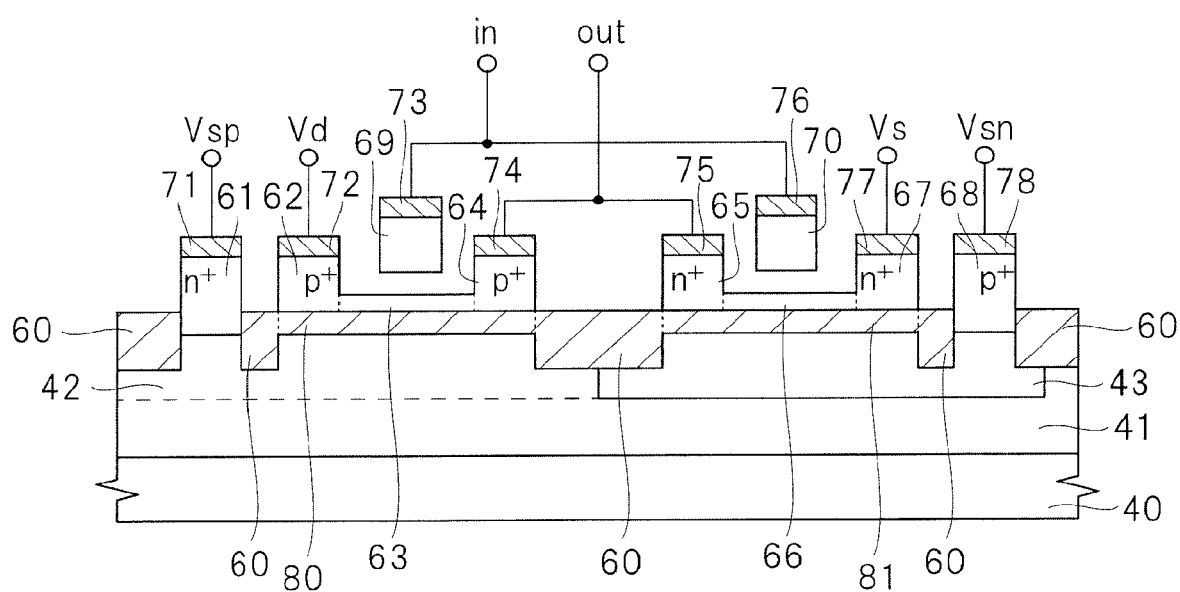

Similarly to FIG. 3A, in FIG. 3B, a common P-type silicon substrate 40 is formed, the N-type well region 41 is formed in the P-type silicon substrate 40, the N-type well region 42 is formed in the N-type well region 41, and the P-type well region 43 is formed in the N-type well region 41.

On the N-type well region 42, a thin insulation film 80 is formed. On the N-type well region 42, a P⁺-type region 62 serving as the source region of the P-type SOTB transistor (SP1) and a P⁺-type region 64 serving as the drain region are formed so as to interpose the thin insulation film 80. In addition, a silicon region (the silicon thin film region) 63 which substantially does not contain the impurities is formed between the P⁺-type region 62 and the P⁺-type region 64. On the silicon region 63, a gate electrode 69 is formed through an insulation film (the gate insulation film) which is not illustrated. Here, the silicon region 63 is connected to the P⁺-type region 62 and the P⁺-type region 64, and a channel is formed in the silicon region 63 by supplying a voltage to the gate electrode 69. Similarly, in FIG. 3B, for the ease visibility of the drawing, the gate electrode 69 is depicted to be separated from the source region 62 and the drain region 64, but practically the gate electrode 69, the source region 62, and the drain region 64 are formed in an overlapping manner.

In addition, on the N-type well region 42, an N⁺-type region 61 is formed to supply the substrate bias voltage Vsp to the N-type well region 42. In FIG. 3B, an electrode 71 is formed to supply the substrate bias voltage Vsp to the N⁺-type region 61, and an electrode 72 is formed to supply the power source voltage Vd to the source region 62. In addition, an electrode 74 is formed to connect the drain region 64 to the output out, and an electrode 73 is formed to connect the gate electrode 69 to the input in.

On the P-type well region 43, a thin insulation film 81 is formed. On the P-type well region 43, an N⁻-type region 67 serving as the source region of the N-type SCTB transistor (SN1) and an N⁻-type region 65 serving as the drain region are formed so as to interpose the thin insulation film 8*l*. In addition, a silicon region (the silicon thin film region) 66 which substantially does not contain the impurities is formed between the N⁺-type region 65 and the V-type region 67. On the silicon region 66, a gate electrode 70 is formed through an insulation film (the gate insulation film) which is not illustrated. Here, the silicon region 66 is connected to the N⁺-type region 65 and the N⁺-type region 67, and a channel is formed in the silicon region 66 by supplying a voltage to the gate electrode 70. Even in this case, for the ease visibility of the drawing, the gate electrode 70 is depicted to be separated from the source region 67 and the drain region 65, but practically the gate electrode 70, the source region 67, and the drain region 65 are formed in an overlapping manner.

In addition, on the P-type well region 43, a P⁺-type region 68 is formed to supply the substrate bias voltage Vsn to the P-type well region 43. In FIG. 3B, an electrode 78 is formed to supply the substrate bias voltage Vsn to the P⁺-type region 68, and an electrode 77 is formed to supply the ground voltage Vs to the source region 67. In addition, an electrode 75 is formed to connect the drain region 65 to the output out, and an electrode 77 is formed to connect the gate electrode 70 to the input in. Further, in FIG. 3B, an insulation region 60 is the same insulation region for separating elements as that of FIG. 3A.

The thickness of each of the thin silicon region (the silicon thin film region) 63 and 66 and the thin insulation films 80 and 81 is, for example, about 10 nm. In addition, the channel type of the SOTS transistor is determined, for example, by an insulation film provided between the gate electrodes 69 and 70 and the thin silicon regions 63 and 66 (that is, a composition of the gate insulation film). For example, the channel type of the SOTB transistor is determined by adding aluminum or hafnium into the composition of the gate insulation film. In addition, the threshold voltage of the SOTB transistor is determined by the amount of aluminum or hafnium and/or the amount of impurities contained in the thin insulation films 80 and 81.

As illustrated in FIG. 3A, in the P-type MOS transistor and the N-type MOS transistor, the channels are formed in the N-type well region 42 and the P-type well region 43 containing the impurities. Therefore, when the concentrations of the contained impurities vary between the N-type well regions 42 (and/or the P-type well regions 43) formed in the same semiconductor chip, the threshold voltages vary between the P-type MOS transistors (and/or the N-type MOS transistors). In addition, there is a PN conjunction between the source region and the drain region of the N-type well region 42 (the P-type well region 43) and the P-type MOS transistor (the N-type MOS transistor). Therefore, when the substrate bias voltage Vmp (Vmn) is supplied to the N-type well region 42 (the P-type well region 43), a leakage current by the PN conjunction is generated.

For this reason, in the P-type SOTB transistor and the N-type SOTS transistor, the regions 63 and 66 where the channel is formed substantially do not contain the impurities. Therefore, it is possible to lessen the variation in the threshold voltages of the P-type SOTB transistor and the N-type SOTB transistor caused by the variation in the amount of the impurities. In addition, since no impurities are substantially contained, the threshold voltages of the P-type SOTB transistor and the N-type SOTB transistor are changed in proportion to the substrate bias voltages Vsp and Vsn. Furthermore, the N-type well region 42 (the P-type well region 43) to which the substrate bias voltage Vsp (Vsn) is supplied, and the source region and the drain region of the P-type SOTS transistor (the N-type SOTB transistor) are separated by the insulation film (81), so that there is no PN conjunction. Therefore, it is possible to prevent the leakage current caused by the PN conjunction.

The back gate of the P-type MOS transistor (MP1) corresponds to the N-type well region 42 of FIG. 3A, and the back gate of the N-type MOS transistor (MN1) corresponds to the P-type well region 43 of FIG. 3A. In addition, the back gate of the P-type SOTB transistor (SP1) corresponds to the N-type well region 42 of FIG. 3B, and the hack gate of the N-type SOTB transistor (SN1) corresponds to the P-type well region 43 of FIG. 3B.

<Operation of Semiconductor Device 10>

Figure 4:
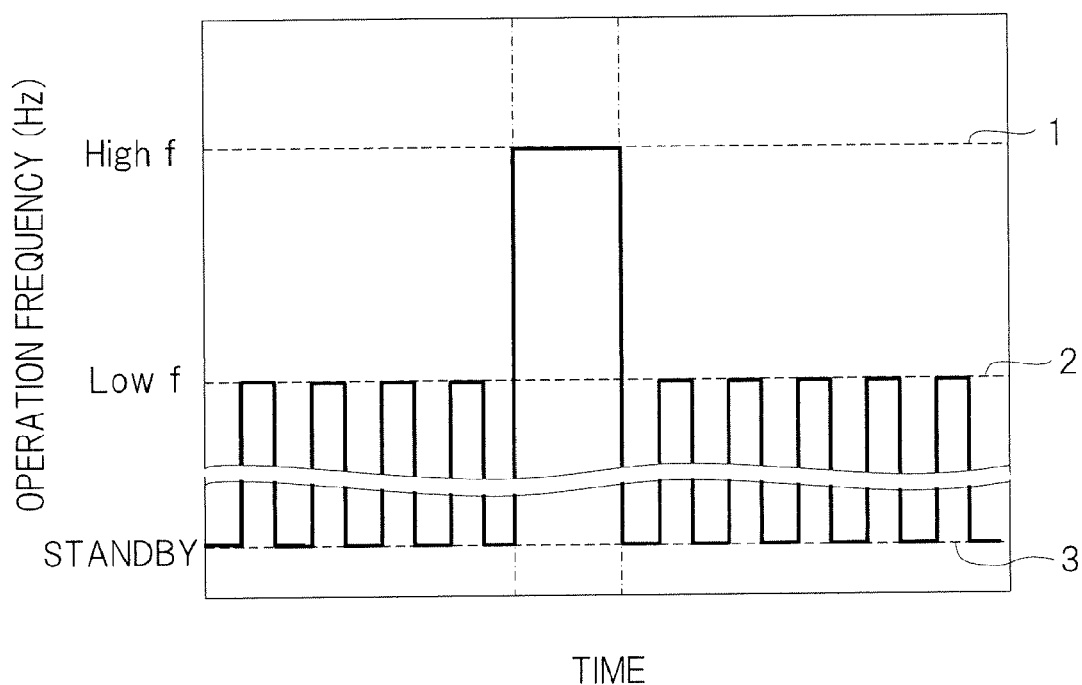
FIG. 4 is a diagram for describing an operation concept of the semiconductor device according to the first embodiment.

FIG. 4 is a diagram for describing an operation concept of the semiconductor device 10 according to the first embodiment. In this drawing, the horizontal axis represents time, and the vertical axis represents an operation frequency in a predetermined circuit block of the semiconductor device 10. The predetermined circuit herein is, for example, the CPU 26.

In FIG. 4, the dotted line 1 indicates the operation frequency in the high speed mode, and the dotted line 2 indicates the operation frequency in the low speed mode. In addition, the dotted line 3 indicates the operation frequency in a standby mode. In the high speed mode 1, as described in FIG. 1, the CPU 26 is operated in synchronization with the high-speed clock signal 20. Therefore, the operation is performed at a high frequency (High f). In addition, in the low speed mode 2, the CPU 26 is operated in synchronization with the low-speed clock signal 21. Therefore, the operation is performed at a low frequency (Low f). On the contrary, in the standby mode, the clock signal is blocked.

The substrate bias circuit 23 generates the substrate bias voltages Vmp, Vmn, Vsp, and Vsn in the low speed mode 2 and the standby mode 3, and supplies the generated voltages to the CPU 26 and the SRAM 30. When the substrate bias voltages Vmp, Vmn, Vsp, and Vsn are supplied to the back gates of the P-type MOS transistor, the N-type MOS transistor, the P-type SOTS transistor, and the N-type SOTB transistor which are included in the CPU 26 and the SRAM 30, the threshold voltages of the transistors are increased. It is possible to significantly reduce the leakage current by increasing the threshold voltages of the transistors. On the other hand, the substrate bias generation circuit 23 does not supply the substrate bias voltages Vmp, Vmn, Vsp, and Vsn to the transistors in the high speed mode 1. Therefore, since the threshold voltages of the transistors are not increased, the CPU 26 and the SRAM 30 can be operated at a high speed.

Further, in the present embodiment, the voltage values of the power source voltage Vd and the ground voltage Vs are not changed but constant even in any one of the high speed mode 1, the low speed mode 2, and the standby mode 3.

Since the supply of the clock signal is blocked in the case of the standby mode 3, a specific circuit block in the CPU 26 enters a sleep state.

The standby mode 3 and the low speed mode 2 are switched at a certain time interval. Therefore, it is possible to make an ultra-standby state in which a low power consumption can be achieved, while performing the process even though it is at the low speed. In the ultra-standby state or the low speed mode 2, the semiconductor device 10 performs a predetermined process which can be performed at a low speed. For example, in the ultra-standby state or the low speed mode 2, the semiconductor device 10 performs a process of realizing a function of the watch. At this time, since the substrate bias voltage is supplied to the back gates of the MOS transistor and the SOTB transistor, the respective threshold voltages are increased, so that the reduction of the leakage current can be achieved. In addition, since the operation frequency is low, the operation current is also reduced. Therefore, it is possible to further reduce the power consumption.

On the other hand, the function of the portable terminal (for example, an application such as a game machine) is operated in the high speed mode 1. Since the substrate bias voltages Vmp, Vmn, Vsp, and Vsn are not supplied to the back gates of the P-type MOS transistor, the N-type MOS transistor, the P-type SOTB transistor, and the N-type SOTB transistor in the high speed mode 1, the threshold voltages of the respective transistors are not increased. As a result, even though the leakage current is increased, the operation frequency is increased at this time, so that the operation current is increased, and the power consumption caused by the increase of the leakage current is in such a degree that can be ignored.

In both of the standby mode 3 and the low speed mode 2, the substrate bias voltages Vmp, Vmn, Vsp, and Vsn are supplied to the back gates of the P-type MOS transistor, the N-type MOS transistor, the P-type SOTB transistor, and the N-type SOTB transistor which are included in the CPU 26 and the SRAM 30. Therefore, the system controller S/C 24 operates the substrate bias generation circuits 23-Vmp, 23-Vmn, 23-Vsp, and 23-Vsn (FIG. 2) by the mode designation signal Vb_Cont only when the designation signal M_Cont supplied from the CPU 26 corresponds to a second mode, and the substrate bias voltages Vmp, Vmn, Vsp, and Vsn are supplied to the back gates. On the other hand, when the designation signal M_Cont supplied from the CPU 26 corresponds to a first mode, the system controller S/C 24 makes the substrate bias generation circuits 23-Vmp, 23-Vmn, 23-Vsp, and 23-Vsn (FIG. 2) enter the non-selection state.

<Threshold Control of SOTB Transistor>

The safe operation in the SRAM 30 is important 30 in order to operate the semiconductor device 10 stably. For the high integration of the semiconductor device 10, as for transistors of the memory cells MC00 to MCnn included in the SRAM 30, the smallest transistors are used among the transistors included in the semiconductor device 10. Since the size is the smallest, the size (width W and length L) of the gate electrode of the transistor also becomes small. For example, in the P-type MOS transistor and the N-type MOS transistor, the threshold voltages of the P-type MOS transistor and the N-type MOSFET are determined by injecting the impurities into the semiconductor region (part of the N-type well region 42 and the P-type well region 43 in FIG. 3A) immediately below the gate electrode.

Since the size of the gate electrode is small, the semiconductor region immediately below the gate electrode also becomes small, and the amount of injecting impurities becomes small. Therefore, when the amount of injecting impurities varies, the characteristics of the P-type MOS transistor and the N-type MOS transistor significantly vary. For example, in a 65 nm SRAM, when the MOS transistors of the memory cell are inspected, the threshold voltage of the MOS transistor varies, for example, by 0.6 V. For example, in a case where the threshold voltage of the MOS transistor of the memory cell is set to 0.2 V, the MOS transistor having a threshold voltage of 0.8 V (0.2 V+0.6 V) may be generated by the variation. This shows that when the power source voltage Vd is lowered by 0.8 V or less, there may be generated a memory cell which is not stably operated. In other words, an operable lower limit voltage of the semiconductor device 10 is determined by an operable lower limit voltage of the memory cell of the SRAM. The memory cell of the SRAM may be considered to be stably operated when the power source voltage Vd is increased, but the increase of the power source voltage Vd causes the increase of the power consumption.

In the present embodiment, each of the memory cells MC00 to MCnn is configured by the P-type SOTB transistors SP1 and SP2 and the N-type SOTB transistors SN1 to SN4. The channel is formed in a region (63 and 66 of FIG. 3B) where no impurities are substantially contained. Therefore, even though the size of these SOTB transistors is small, it is possible to suppress the variation of the threshold voltage caused by the variation of the impurities. For example, it is possible to suppress the variation of the threshold voltage to about 0.2 V. Therefore, even when the power source voltage Vd is low, the SRAM 30 can be stably operated, and the semiconductor device 10 can be stably operated.

Furthermore, in the present embodiment, the threshold voltage of the P-type SOTB transistor is controlled by the substrate bias circuit 23 in order to operate the SRAM 30 stably.

Figure 5:
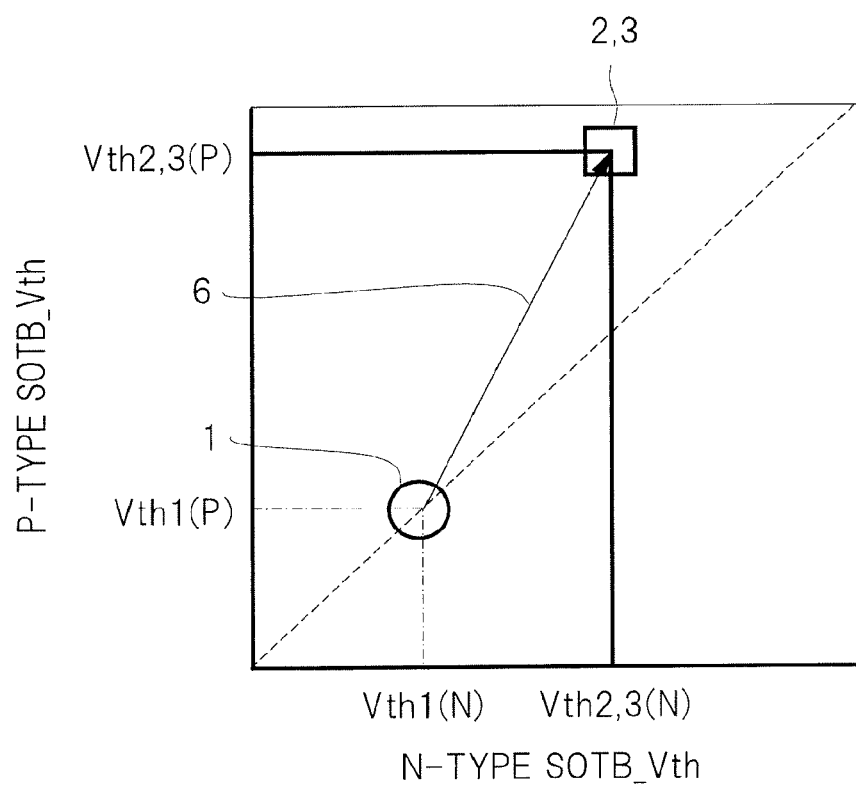
FIG. 5 is a characteristic diagram illustrating changes in threshold voltages of a P-type SOTB transistor and an N-type SOTB transistor according to the first embodiment.

FIG. 5 is a characteristic diagram illustrating changes of the threshold voltages of the P-type SOTB transistors SP1 and SP2 and the N-type SOTS transistor SN1 to SN4 when the substrate bias voltages Vsp and Vsn are changed. In this drawing, the horizontal axis represents a change of the threshold voltage (Vth) of the N-type SOTB transistor when the absolute value of the substrate bias voltage Vsn is increased, and the vertical axis represents a change of the threshold voltage (Vth) of the P-type SOTB transistor when the absolute value of the substrate bias voltage Vsp is increased.

In the high speed mode 1, the substrate bias voltage is not supplied to the back gate of each of the P-type SOTB transistors SP1 and SP2 and the N-type SOTB transistors SN1 to SN4. In the high speed mode 1, since the CPU 26 and the SRAM 30 are operated in synchronization with the high-speed clock signal 20, the SRAM 30 is configured to set the threshold voltages of the P-type SOTB transistors SP1 and SP2 and the threshold voltages of the N-type SOTB transistors SN1 to SN4 to the same values Vth1(P) and Vth1(N) in order to maximize the operation margin. In other words, in a state where the substrate bias voltage Vsp is not supplied to the P-type SOTB transistors SP1 and SP2, and the substrate bias voltage Vsn is not supplied to the N-type SOTB transistors SN1 to SN4, the absolute values Vth1(P) of the threshold voltages of these P-type SOTB transistors and the absolute values Vth1(N) of the threshold voltages of these N-type SOTB transistors are set to the threshold voltage Vth1. Further, in FIG. 5, the threshold voltage of the P-type SOTB transistor and the N-type SOTB transistor in the high speed mode 1 is indicated with a circular symbol.

When the low speed mode 2 is designated, the voltages of the back gates of the P-type SOTB transistors SP1 and SP2, and the voltages of the back gates of the N-type SOTB transistors SN1 to SN4 are increased in the absolute value according to the substrate bias voltages Vsp and Vsn from the substrate bias generation circuits 23-Vsp and 23-Vsn. Therefore, the absolute values of the threshold voltages of the N-type SOTB transistors SN1 to SN4 are changed to be increased as illustrated by the broken line in FIG. 5. Further, as described above, the threshold voltage of the SOTB transistor is changed in proportion to the voltage supplied to the back gate.

As will be descried below using FIGS. 7 and 8, in order to stably operate the SRAM 30, the absolute values of the threshold voltages of the P-type SOTB transistors SP1 and SP2 are desirably set to two or more times the absolute values of the threshold voltages of the N-type SOTB transistors SN1 to SN4. Therefore, the substrate bias generation circuit 23-Vsp generates the substrate bias voltage Vsp which is two or more times the absolute value of the substrate bias voltage Vsn generated by the substrate bias generation circuit 23-Vsn. With this configuration, the absolute values of the threshold voltages of the N-type SOTB transistors SN1 to SN4 are increased along the broken line, and the threshold voltages of the P-type SOTB transistors SP1 and SP2 are increased along the solid line 6. As a result, in the low speed mode 2, the absolute value of the threshold voltage of the P-type SOTB transistor becomes the threshold voltage Vth2,3(P) indicated with a rectangular symbol. On the contrary, since the absolute value of the threshold voltage of the N-type SOTB transistor is increased along the broken line, in the low speed mode 2, the absolute value becomes the threshold voltage Vth2,3(N), and the absolute value is smaller than that of the threshold voltage Vth2,3(P) of the P-type SOTB transistor.

Even in the standby mode 3, the substrate bias voltages Vsp and Vsn of the same values in the low speed mode 2 are supplied to the back gates of the P-type SOTB transistor and the N-type SOTB transistor. Therefore, even in the standby mode 3, the threshold voltages of the P-type SOTB transistors SP1 and SP2 become Vth2, 3(P), and the threshold voltages of the N-type SOTB transistors SN1 to SN4 become Vth2,3(N).

In the low speed mode 2 and the standby mode 3, the substrate bias voltages Vmp and Vmn are supplied from the substrate bias generation circuits 23-Vmp and 23-Vmn to the back gate of each of the P-type MOS transistor (for example MP1 and MP2 of FIG. 2) and the N-type MOS transistor (for example, MN1 and MN2 of FIG. 2) of the peripheral circuit PRK which is included in the CPU 26 and the SRAM 30. The P-type MOS transistor and the N-type MOS transistor are also set to the same threshold voltage in the absolute value in order to maximize the operation margin in the high speed mode 1. In other words, when the substrate bias voltage is not supplied to the back gates of the P-type MOS transistor and the N-type MOS transistor, the absolute value of the threshold voltage of the P-type MOS transistor is set to be equal to that of the N-type MOS transistor.

In the low speed mode 2 and the standby mode 3, the absolute values of the threshold voltages of the P-type MOS transistor and the N-type MOS transistor are increased by supplying the substrate bias voltages Vmp and Vmn. In order to increase the absolute values of the threshold voltages of the P-type MOS transistor and the N-type MOS transistor in a state where the operation margin is maintained, the present embodiment is configured such that the substrate bias voltages Vmp and Vmn having the same absolute value are generated and supplied by the substrate bias generation circuits 23-Vmp and 23-Vmn. In this way, the threshold voltage of the P-type MOS transistor and the threshold voltage of the N-type MOS transistor reach a high value in the low speed mode 2 and the standby mode 3 while maintaining the absolute values equal to each other by supplying the substrate bias voltages Vmp and Vmn having the same absolute value to the back gates of the P-type MOS transistor and the N-type MOS transistor.

Since the value of the substrate bias voltage Vmn supplied to the back gate of the N-type MOS transistor is set to be equal to the value of the substrate bias voltage Vsn supplied to the back gate of the N-type SOTB transistor, the substrate bias generation circuit 23-Vmn or 23-Vsn illustrated in FIG. 2 does not need to be provided. In this case, both of the substrate bias voltages Vmn and Vsn are formed by the other substrate bias generation circuit 23-Vsn or 23-Vmn. Similarly, since the value of the substrate bias voltage Vmp supplied to the back gate of the P-type MOS transistor is set to be equal to the value of the substrate bias voltage Vsp supplied to the back gate of the P-type SOTB transistor, the substrate bias generation circuit 23-Vmp or 23-Vsp illustrated in FIG. 2 does not need to be provided. In this case, both of the substrate bias voltages Vmp and Vsp are formed by the other substrate bias generation circuit 23-Vsp or 23-Vmp.

In this way, the number of substrate bias generation circuits provided in the substrate bias generation circuit 23 can be reduced to 3 by setting the substrate bias voltages Vmn and Vsn (or Vmp and Vsp) to the same voltage, and the semiconductor device 10 can be manufactured in a small size.

Figure 6:
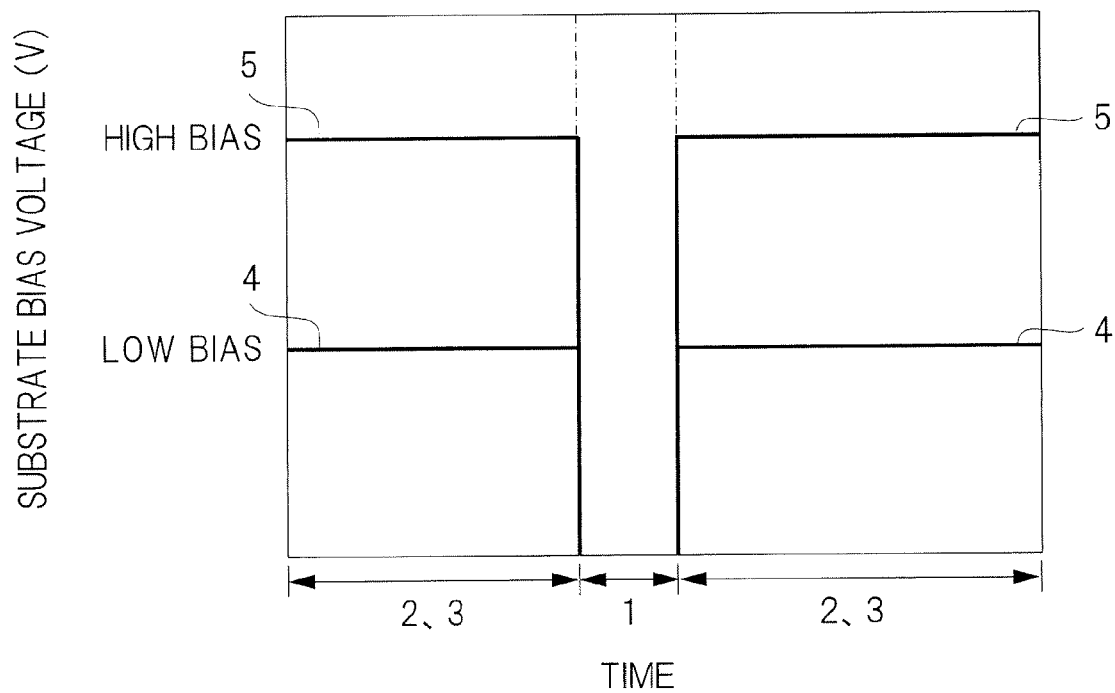
FIG. 6 is a waveform diagram schematically illustrating a change in a substrate bias voltage generated by a substrate bias circuit.

FIG. 6 is a waveform diagram schematically illustrating a change of the substrate bias voltage generated by the substrate bias generation circuit 23. In this drawing, the horizontal axis represents time, and the vertical axis represents the absolute value of the substrate bias voltage. In FIG. 6, period 1 indicates a period when the semiconductor device 10 is operated in the high speed mode 1, and period 2,3 indicates a period when the semiconductor device 10 is operated in the low speed mode 2 and the standby mode 3. For example, period 2,3 indicates a period when the semiconductor device 10 is operated in the above-described ultra-standby state.

The substrate bias generation circuits 23-Vsp and 23-Vsn does not supply the substrate bias voltages Vsp and Vsn to the back gate of the SOTB transistor in the high speed mode 1. On the contrary, in the low speed mode 2 and the standby mode 3, the substrate bias generation circuit 23-Vsn supplies the substrate bias voltage Van of a low bias voltage 4 to the back gate of the N-type SOTB transistor, and the substrate bias generation circuit 23-Vsp supplies the substrate bias voltage Vsp of a high bias voltage 5 to the back gate of the P-type SOTB transistor. In the present embodiment, in order to stably operate the SRAM 30, the absolute value of the high bias voltage 5 is set to two or more times that of the low bias voltage 4 in order to set the absolute value of the threshold voltage of the P-type SOTB transistor to two or more times that of the threshold voltage of the N-type SOTB transistor.

The substrate bias generation circuits 23-Vmn and 23-Vmp also does not supply the substrate bias voltages Vmp and Vmn to the back gates of the P-type MOS transistor and the N-type MOS transistor in period 1 of the high speed mode 1. On the other hand, in the low speed mode 2 and the standby mode 3, the substrate bias generation circuits 23-Vmn and 23-Vmp generate the substrate bias voltages Vmp and Vmn of which the absolute values are the same as that of the low bias voltage 4 or the high bias voltage 5. In this case, since the substrate bias voltage Vsp can be used as the substrate bias voltage Vmp, or the substrate bias voltage Vsn can be used as the substrate bias voltage Vmn, the number of substrate bias generation circuits provided in the substrate bias generation circuit 23 can be reduced to 3.

<Stable Operation of Semiconductor Device>

As described above, the power source voltage Vd is determined by the power source voltage of the memory cells MC00 to MCnn included in the SRAM 30 in order to operate the semiconductor device 10 stably. In other words, when the power source voltage Vd of the semiconductor device 10 is reduced, first the SRAM 30 is operated unstably.

The inventors have performed a simulation to inspect whether the power source voltage for the stable operation of the SRAM 30 is changed by the threshold voltage of the P-type SOTB transistor and the threshold voltage of the N-type SOTB transistor in a case where the memory cells MC00 to MCnn are configured by the P-type SOTB transistors SP1 and SP2 and the N-type SOTB transistors SN1 to SN4 as illustrated in FIG. 2. FIGS. 7 and 8 are characteristic diagrams illustrating a relation between the threshold voltage and the power source voltage obtained by the simulation. In FIGS. 7 and 8, the horizontal axis represents a ratio (Vth(P-type SOTB)/Vth(N-type SOTB)) of the threshold voltage (Vth(P-type SOTB)) of the P-type SOTB transistor to the threshold voltage (Vth(N-type SOTB)) of the N-type SOTB transistor, and the vertical axis represents the power source voltage Vd (a voltage corresponding to the ground voltage Vs) at which the SRAM is stably operated. Here, FIG. 7 illustrates a state in the high speed mode 1 when the substrate bias voltage is not supplied, and FIG. 8 illustrates a state in the low speed mode 2 when the substrate bias voltage is supplied. In FIGS. 7 and 8, it means that an operation range is widened as an operating voltage Vdmin shown in the vertical axis is lowered. In other words, it means that the operation margin is increased as the operating voltage Vdmin is lowered.

Figure 7:
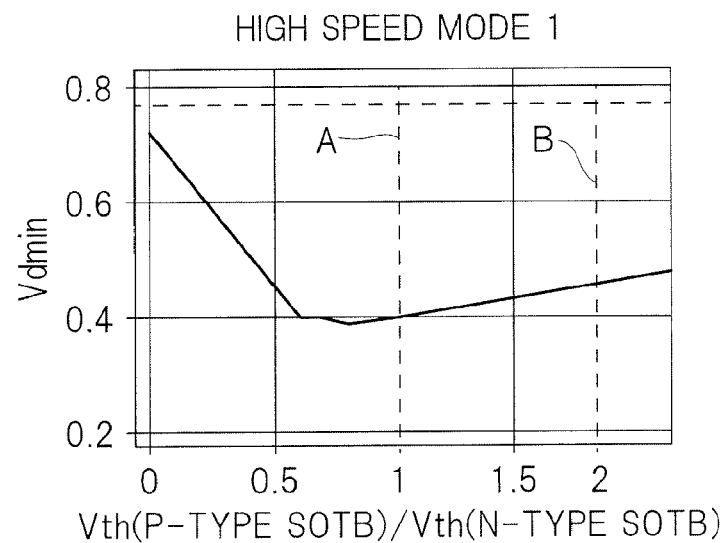
FIG. 7 is a characteristic diagram illustrating a relation between a threshold voltage and a power source voltage in a high speed mode obtained by a simulation.
Figure 8:
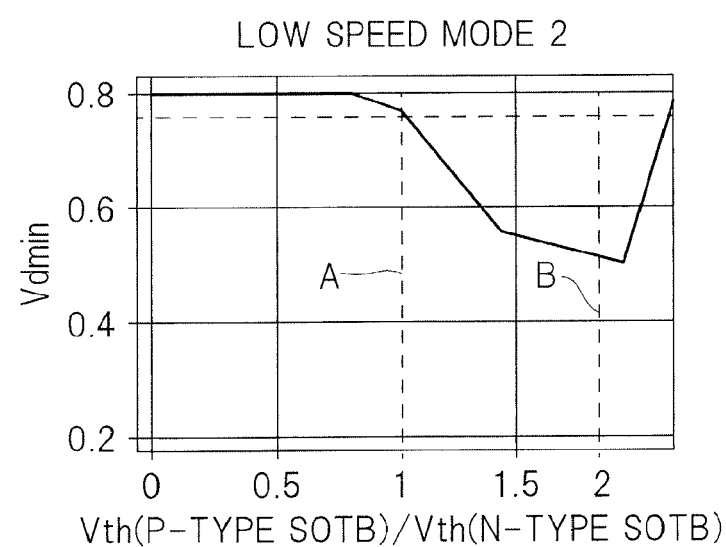
FIG. 8 is a characteristic diagram illustrating a relation between the threshold voltage and the power source voltage in a low speed mode obtained by a simulation.

In FIG. 7, the broken line A indicates a case where the ratio of the threshold voltage of the P-type SOTB transistor to the threshold voltage of the N-type SOTB transistor is 1. In other words, the broken line A indicates a case where the threshold voltage of the P-type SOTB transistor is equal to the threshold voltage of the N-type SOTB transistor.

A minimum operating voltage at which the SRAM is operable is increased when the threshold voltage Vth(P-type SOTB) of the N-type SOTB transistor is larger than the threshold voltage Vth(N-type SOTB) of the P-type SOTB transistor, and is lowered when the ratio of the thresholds approaches 1. In other words, the operation margin becomes large around which the threshold voltage Vth(P-type SOTB) becomes almost equal to the threshold voltage Vth (N-type SOTB). As the threshold voltage Vth(P-type SOTB) of the P-type SOTB is increased and the ratio is increased, the minimum operating voltage is gradually increased. Therefore, even when the ratio is increased by two or more times (the broken line B), the minimum operating voltage becomes relatively low, and the operation margin becomes relatively large.

When the substrate bias voltage is supplied, the minimum operating voltage of the SRAM is changed as illustrated in FIG. 6. In other words, the minimum operating voltage Vdmin becomes low when the ratio becomes smaller than about one times, and falls to the lowest level around which the ratio becomes two or more times. In other words, the operation margin becomes large when the ratio of the threshold voltage of the P-type SOTB transistor to the threshold voltage of the N-type SOTB transistor becomes two or more times. On the contrary, the operation margin is worsened around which the ratio is about one times.

In this way, in a case where the substrate bias voltage is not supplied, the operation margin of the SRAM becomes large when the ratio of the threshold voltage of the P-type SOTB transistor to the threshold voltage of the N-type SOTB transistor is about one times (equal). On the other hand, in a case where the substrate bias voltage is supplied, the operation margin is enhanced when the ratio of the threshold voltage of the P-type SOTB transistor to the threshold voltage of the N-type SOTB transistor becomes large, and the operation margin becomes large when the ratio is two or more times. Therefore, when the substrate bias voltage is supplied, the ratio of the threshold voltage of the P-type SOTB transistor to the threshold voltage of the N-type SOTB transistor may be set to one or more times, and preferably two or more times.

Second Embodiment

The semiconductor device according to a second embodiment is different from the first embodiment in that the voltage value of the substrate bias voltage generated by the substrate bias generation circuit 23 is changed. The configuration of the semiconductor device is the same as that of the first embodiment except that the number of substrate bias generation circuits is changed. The operation of the substrate bias circuit 23 is the same as that of the first embodiment, and the description thereof will not be repeated.

Figure 9:
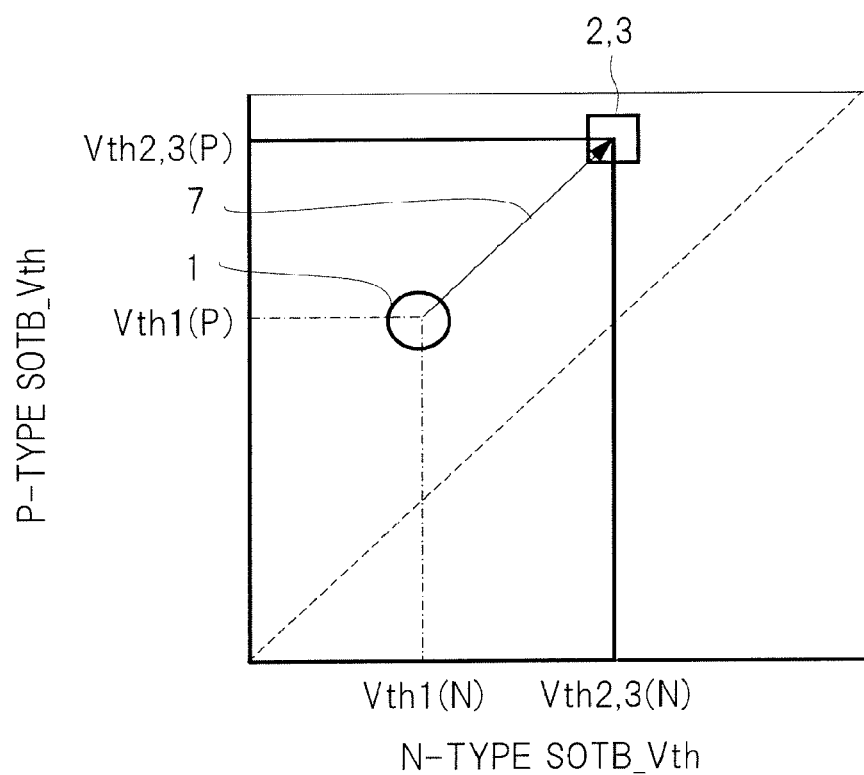
FIG. 9 is a characteristic diagram illustrating characteristics of a P-type SOTS transistor and an N-type SOTS transistor according to a second embodiment.

FIG. 9 is a characteristic diagram illustrating the characteristics of the P-type SOTB transistor and the N-type SOTB transistor according to the second embodiment. Similarly to FIG. 5, FIG. 9 illustrates a characteristic of the changes of the threshold voltages of the P-type SOTB transistors SP1 and SP2 and the N-type SOTB transistors SN1 to SN4 when the substrate bias voltages Vsp and Vsn are changed.

In this drawing, the broken line indicates a change of the threshold voltage of the N-type SOTB transistor, and the solid line 7 indicates a change of the threshold voltage of the P-type SOTB transistor. In the second embodiment, the absolute values of the threshold voltages of the P-type SOTB transistors SP1 and SP2 are set to be larger than the absolute values of the N-type SOTB transistors SN1 to SN4. For example, the absolute values of the threshold voltages of the P-type SOTB transistors SP1 and SP2 are set to two or more times the absolute values of the threshold voltages of the N-type SOTB transistors SN1 to SN4. Such a setting of the threshold voltage is determined, for example, when the semiconductor device is manufactured by changing the amount of aluminum or hafnium contained in the gate insulation film and/or by changing the amount of impurities contained in the thin insulation films 80 and 81 (FIGS. 3A and 3B) with respect to each of the P-type SOTS transistors SP1 and SP2 and the N-type SOTB transistors SN1 to SN4.

In the high speed mode 1, the substrate bias circuit 23 does not supply the substrate bias voltages Vsp and Vsn to the back gates of the P-type SOTB transistors SP1 and SP2 and the N-type SOTB transistors SN1 to SN4. In addition, the substrate bias voltages Vmp and Vmn are also not supplied to the back gates of the P-type MOS transistor and the N-type MOS transistor included in the peripheral circuit PRK (FIG. 2) of the CPU 26 and the SRAM 30. The threshold voltages (N-type MOSTB_Vth) of the N-type SOTB transistors SN1 to SN4 are changed as depicted by the broken line in FIG. 9 according to the change of the substrate bias voltage Vmn, but since the substrate bias voltage is not supplied to each of the N-type SOTB transistors SN1 to SN4 in the high speed mode 1, the threshold voltage becomes Vth1(N). On the other hand, when the substrate bias voltage Vsn is supplied to each of the N-type SOTB transistors SN1 to SN4, the absolute value of the threshold voltage of the N-type SOTB transistor is increased, and the absolute value of the threshold voltage becomes Vth2,3(N) in the low speed mode 2 and the standby mode 3.

On the other hand, the absolute value of the threshold voltage (P-type SOTB_Vth) of each of the P-type SOTB transistors SP1 and SP2 becomes Vth1(P) in the high speed mode 1. The absolute value Vth(P) of the threshold voltage of each of the P-type SOTB transistors SP1 and SP2 becomes two or more times the threshold voltage Vth(N) of each of the N-type SOTB transistors SN1 to SN4.

In the low speed mode 2 or the standby mode 3, the substrate bias voltages Vsp and Vsn are supplied to the back gates of the P-type SOTB transistor and the N-type SOTB transistor by the substrate bias circuit 23. In the second embodiment, in the low speed mode 2 or the standby mode 3, the absolute values of the substrate bias voltage Vsp and Vsn generated by the substrate bias circuit 23 are set to be equal to each other. In other words, the substrate bias generation circuits 23-Vsp and 23-Vsn generate the substrate bias voltages Vsp and Vsn having the same absolute value.

Therefore, the absolute value of the threshold voltage of each of the P-type SOTS transistors SP1 and SP2 and the absolute value of the threshold voltage of each of the N-type transistors SN1 to SN4 are changed while keeping the difference of two or more times (the voltage difference between the threshold voltages) therebetween, and the mode is shifted from the high speed mode 1 to the low speed mode 2 and/or the standby mode 3. In FIG. 9, the absolute value of the threshold voltage of the P-type SOTB transistor in the low speed mode 2 and the standby mode 3 is denoted as Vth2,3(P), and the value is two or more times the absolute value Vth2,3(N) of the threshold voltage of the N-type SOTB transistor.

With this configuration, similarly to the first embodiment, the SRAM 30 can be stably operated even in the low speed mode 2 or the standby mode 3.

In the second embodiment, the threshold voltage of each of the P-type MOS transistors MP1 and MP2 and the N-type MOS transistors MN1 and MN2 is set to be equal in the absolute value. In the high speed mode 1, the substrate bias voltage is not supplied from the substrate bias circuit 23 to the back gate of each of the P-type MOS transistors MP1 and MP2 and the N-type MOS transistors MN1 and MN2, and in the low speed mode 2 and the standby mode 3, the substrate bias voltage is suppled from the substrate bias circuit 23. Therefore, in the high speed mode 1, the threshold voltage of the P-type MOS transistor and the threshold voltage of the N-type MOS transistor are set to the absolute values equal to each other, so that the operation margin can be made large.

On the other hand, in the low speed mode 2 and the standby mode 3, the substrate bias voltage Vsp generated by the substrate bias generation circuit 23-Vsp is supplied as the substrate bias voltage Vmp to the back gates of the P-type MOS transistors MP1 and MP2, and the substrate bias voltage Vsn generated by the substrate bias generation circuit 23-Vsn is supplied as the substrate bias voltage Vmn to the back gates of the N-type MOS transistors MN1 and MN2.

With this configuration, in the low speed mode 2 and/or the standby mode 3, the substrate bias voltages Vmp and Vmn having the same absolute value are supplied to the back gates of the P-type MOS transistor and the N-type MOS transistor of the peripheral circuit PRK in the CPU 26 and the SRAM 30. The threshold voltages of the P-type MOS transistor and the N-type MOS transistor are increased by supplying the substrate bias voltages Vmp and Vmn while maintaining the absolute values equal to each other. As a result, in the low speed mode 2 and the standby mode 3, the threshold voltage of each of the P-type MOS transistor and the N-type MOS transistor of the peripheral circuit PRK in the CPU 26 and the SRAM 30 is increased in a state where the absolute values are maintained to be equal to each other, and thus a reduction of the power consumption can be achieved in the low speed mode 2 and the standby mode 3.

In the second embodiment, the substrate bias voltage generated by the substrate bias generation circuit 23-Vsp is used as the substrate bias voltages Vsp and Vmp, and the substrate bias voltage generated by the substrate bias generation circuit 23-Vsn is used as the substrate bias voltages Vsn and Vmn. Therefore, the substrate bias circuit 23 can be configured by two substrate bias generation circuits 23-Vsp and 23-Vsn, and the semiconductor device 10 can be suppressed from being increased in size. Further, in the high speed mode 1, the absolute value of the threshold voltage of the P-type SOTS transistor is increased, but there is no actual problem in the operation margin.

As described above, in the low speed mode 2 and the standby mode 3, since the substrate bias voltage is supplied to the back gate of each of the P-type SOTS, transistor, the N-type SOTS transistor, the P-type MOS transistor, and the N-type MOS transistor, the threshold voltage (the absolute value) of each transistor can be increased, and thus a reduction of the power consumption of the semiconductor device 10 can be achieved. In addition, a stable operation can be achieved in the low speed mode 2 and the standby mode 3.

In the first and second embodiments, the description has been made about that the substrate bias voltage is not supplied from the substrate bias circuit 23 to the back gate of each of the P-type SOTB transistor, the N-type SOTB transistor, the P-type MOS transistor, and the N-type MOS transistor in the high speed mode 1, and it means that the substrate bias voltage is not supplied for increasing the threshold voltage of each transistor. Therefore, in the high speed mode 1, the substrate bias circuit 23 may supply the same voltage as that of the source of each transistor to the back gate of each transistor. In other words, in the high speed mode 1, the substrate bias circuit 23 may supply the same voltage as that of the source of the P-type SOTB transistor to the back gate of the P-type SOTB transistor, and may supply the same voltage as that of the source of the N-type SOTB transistor to the back gate of the N-type SOTB transistor. In addition, in the high speed mode 1, the substrate bias circuit 23 may supply the same voltage as that of the source of the P-type MOS transistor to the back gate of the P-type MOS transistor, and may supply the same voltage as that of the source of the N-type MOS transistor to the back gate of the N-type MOS transistor.

Alternatively, the substrate bias circuit 23 may set the back gate of each transistor to enter a floating state in the high speed mode 1.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the substrate bias voltage generated by the substrate bias circuit may be supplied to the back gates of all of the P-type SOTB transistors, the N-type SOTB transistors, the P-type MOS transistors, and the N-type MOS transistors included in the semiconductor device 10 in the low speed mode 2 and the standby mode 3. However, in a case where the semiconductor device 10 includes an analog circuit, it is desirable that the substrate bias voltage be not supplied to the back gate of the transistor of the analog circuit.

In addition, the invention has been described about a case where there are provided three modes of the high speed mode 1, the low speed mode 2, and the standby mode 3, but the number of modes is not limited thereto. For example, only the high speed mode 1 and the low speed mode 2 (or the standby mode 3) may be provided. Even in this case, in the high speed mode 1, the substrate bias voltage may be not supplied from the substrate bias circuit 23 to the back gate of the transistor, and the substrate bias voltage may be supplied in the low speed mode 2 (or the standby mode 3).

What is claimed is:

1. A semiconductor integrated circuit device comprising:
   a first circuit including a P-type transistor and an N-type transistor;
   a second circuit including a P-type SOTB transistor and an N-type SOTB transistor; and
   a voltage supplying circuit for supplying a voltage to the first circuit and the second circuit,
   wherein the P-type SOTB transistor includes a first gate electrode, a first source region, a first drain region, a first channel region, which is arranged between the first source region and the first drain region and in which a channel is formed, a first insulation film, and a first region which faces the first channel region through the first insulation film,
   wherein the N-type SOTB transistor includes a second gate electrode, a second source region, a second drain region, a second channel region, which is arranged between the second source region and the second drain region and in which a channel is formed, a second insulation film, and a second region which faces the second channel region through the second insulation film,
   wherein the first circuit includes an input/output circuit,
   wherein the second circuit includes a memory cell,
   wherein the semiconductor integrated circuit device has a first operation mode and a second operation mode,
   wherein the voltage supplying circuit outputs a first voltage and a second voltage, and
   wherein, in the first operation mode, the first voltage is supplied to the first region of the P-type SOTB transistor and the second voltage is supplied to the second region of the N-type SOTB transistor.

2. The semiconductor integrated circuit device according to claim 1,
   wherein the P-type transistor includes a third gate electrode, a third source region, a third drain region, a third channel region, which is arranged between the third source region and the third drain region and in which a channel is formed, and a third region formed under the third channel region, and
   wherein an impurity concentration of the first channel region is lower than an impurity concentration of the third channel region.

3. The semiconductor integrated circuit device according to claim 2,
   wherein the N-type transistor includes a fourth gate electrode, a fourth source region, a fourth drain region, a fourth channel region, which is arranged between the fourth source region and the fourth drain region and in which a channel is formed, and a fourth region formed under the fourth channel region, and
   wherein an impurity concentration of the second channel region is lower than an impurity concentration of the fourth channel region.

4. The semiconductor integrated circuit device according to claim 1,
   wherein the first voltage is different from the second voltage.

5. The semiconductor integrated circuit device according to claim 3, further comprising an SRAM,
   wherein the SRAM includes the memory cell and a peripheral circuit connected to the memory cell.

6. The semiconductor integrated circuit device according to claim 5,
   wherein an operation frequency of the first operation mode is lower than an operation frequency of the second operation mode.

* * * * *